(12) United States Patent
Nakano

(10) Patent No.: US 11,069,267 B2
(45) Date of Patent: Jul. 20, 2021

(54) DISPLAY DEVICE AND METHOD FOR CHECKING DISPLAY DEVICE

(71) Applicant: JOLED INC., Tokyo (JP)

(72) Inventor: Yutaka Nakano, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/456,515

(22) Filed: Jun. 28, 2019

(65) Prior Publication Data

US 2020/0051475 A1     Feb. 13, 2020

(30) Foreign Application Priority Data

Aug. 8, 2018     (JP) .............................. JP2018-149187

(51) Int. Cl.
*G09G 3/00* (2006.01)
*H05K 1/02* (2006.01)
(Continued)

(52) U.S. Cl.
CPC ............ *G09G 3/006* (2013.01); *G09G 3/32* (2013.01); *H05K 1/0268* (2013.01); *G09G 2330/026* (2013.01); *H01R 12/79* (2013.01)

(58) Field of Classification Search
CPC ............... H05K 1/148; H05K 1/0268; H05K 2201/10128; H05K 2201/10189;
(Continued)

(56) References Cited

U.S. PATENT DOCUMENTS

2011/0204800 A1*   8/2011   Lin ..................... G09G 3/342
                                                            315/185 R
2015/0187317 A1    7/2015   Seo et al.
(Continued)

FOREIGN PATENT DOCUMENTS

JP       S58-162064 U     10/1983
JP       2002-329941      11/2002
(Continued)

OTHER PUBLICATIONS

Japan Office Action, dated Aug. 25, 2020, for the corresponding Japan Patent Application No. 2018-149187.
(Continued)

*Primary Examiner* — Christopher E Leiby
(74) *Attorney, Agent, or Firm* — Greenblum & Bernstein, P.L.C.

(57) ABSTRACT

A display device includes: a display panel; a main wiring board; a first wiring board that includes a first feedback line; and a first cable that is removably coupled to the main wiring board and the first wiring board. The main wiring board includes: a first output line; a first input line; a first circuit (a power supply circuit) that outputs a first voltage to the first output line; and a control circuit that is connected with the first input line. The first cable includes: a first forward conductor that directly or indirectly connects the first output line and the first feedback line; and a first return conductor that directly or indirectly connects the first input line and the first feedback line. The control circuit determines whether the first voltage is input, and when an input of the first voltage is determined, starts a display on the display panel.

6 Claims, 11 Drawing Sheets

(51) Int. Cl.
*G09G 3/32* (2016.01)
*H01R 12/79* (2011.01)

(58) Field of Classification Search
CPC ........ G09G 3/32; G09G 3/3208; G09G 3/006;
G09G 3/3406; G09G 2330/026; G09G
2330/12; G09G 2330/04; G09G 2310/08;
G09G 2300/0452; G09G 2320/041; H01R
12/79; G02F 2001/133628; G02F
1/133621
See application file for complete search history.

(56) References Cited

U.S. PATENT DOCUMENTS

| | | |
|---|---|---|
| 2017/0277586 A1* | 9/2017 | Ito .................... G06F 11/1451 |
| 2017/0287389 A1* | 10/2017 | Kang ................ G02F 1/133621 |
| 2017/0322608 A1 | 11/2017 | Lee |
| 2018/0204533 A1 | 7/2018 | Sasaki et al. |

FOREIGN PATENT DOCUMENTS

| | | | |
|---|---|---|---|
| JP | 2008-241748 A | 10/2008 | |
| JP | 2010-225922 A | 10/2010 | |
| WO | 2017/033844 A1 | 3/2017 | |

OTHER PUBLICATIONS

Japan Office Action, dated Nov. 17, 2020, for the corresponding Japan Patent Application No. 2018-149187.

* cited by examiner

DISPLAY DEVICE AND METHOD FOR CHECKING DISPLAY DEVICE

CROSS REFERENCE TO RELATED APPLICATION

The present application is based on and claims priority of Japanese Patent Application No. 2018-149187 filed on Aug. 8, 2018. The entire disclosure of the above-identified application, including the specification, drawings and claims is incorporated herein by reference in its entirety.

FIELD

The present disclosure relates to a display device and a method for checking the display device.

BACKGROUND

Conventionally, a display panel using, for example, an organic electroluminescent (EL) panel, is connected, via a flexible wiring board, with a printed circuit board which supplies a voltage and the like to a plurality of pixel circuits arranged in a matrix in the display panel (for example, Patent Literature (PTL) 1).

CITATION LIST

Patent Literature

PTL 1: Japanese Unexamined Patent Application Publication No. 2002-329941

SUMMARY

Technical Problem

Although the printed circuit board and the flexible wiring board described in PTL 1 enlarge as a display panel enlarges, the enlargement of the printed circuit board and the flexible wiring board is structurally difficult, and leads to a substantial increase in cost. For this reason, it is conceivable that the printed circuit board and the flexible wiring board are divided into a plurality of printed circuit boards and into a plurality of flexible wiring boards, but this result in an increase in the number of cables that connect the printed circuit boards. Accordingly, work for connecting cables increases, and thus the number of poor cable connections may increase. Furthermore, such poor cable connections are not always readily detectable. For example, even if some cables for supplying voltages to pixel circuits have poor connection, voltages from other cables may be supplied to the pixel circuits via a power supply line of a display panel. Accordingly, there may be a case where an anomaly is not immediately detectable by merely visually checking the display state of a display panel.

The present disclosure has been conceived in view of the above problems, and provides a display device and the like which can readily detect a connection failure of a cable that connects wiring boards.

Solution to Problem

In order to provide a display device and the like which can readily detect a connection failure of a cable that connects wiring boards, the display device according to an aspect of the present disclosure includes: a display panel; a main wiring board; a first wiring board that includes a first feedback line; and a first cable that is removably coupled to the main wiring board and the first wiring board, wherein the main wiring board includes: a first output line; a first input line; a first circuit that outputs a first voltage to the first output line; and a control circuit that is connected with the first input line, and the first cable includes: a first forward conductor that directly or indirectly connects the first output line and the first feedback line; and a first return conductor that directly or indirectly connects the first input line and the first feedback line, and the control circuit determines whether the first voltage is input, and when an input of the first voltage is determined, starts a display on the display panel.

In addition, in order to provide a display device and the like which can readily detect a connection failure of a cable that connects wiring boards, in a method for checking the display device according to an aspect of the present disclosure, the display device that includes: a display panel; a main wiring board; a first wiring board that includes a first feedback line; and a first cable that removably connects the main wiring board and the first wiring board, the main wiring board including: a first output line; a first input line; a first circuit that outputs a first voltage to the first output line; and a control circuit that is connected with the first input line, the first cable including: a first forward conductor that directly or indirectly connects the first output line and the first feedback line; and a first return conductor that directly or indirectly connects the first input line and the first feedback line, the method includes: outputting the first voltage by the first circuit; determining whether the first voltage is input to the control circuit; and starting a display on the display panel, when an input of the first voltage to the control circuit is determined.

Advantageous Effects

According to the present disclosure, it is possible to provide a display device and the like which can readily detect a connection failure of a cable that connects wiring boards.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Hereinafter, embodiments according to the present disclosure will be described with reference to the drawings. The embodiments described below show specific examples according to the present disclosure. Therefore, the numerical values, shapes, materials, structural elements, the arrangement and connection of the structural elements, processes, the order of the processes, and the like described in the following embodiments are mere examples, and thus are not intended to limit the present disclosure. Accordingly, among the elements in the following exemplary embodiments, elements not recited in any of the independent claims defining the broadest concept of the present disclosure are described as optional elements.

Note that the drawings are schematic diagrams, and do not necessarily provide strictly accurate illustration. Throughout the drawings, the same sign is given to substantially the same configuration, and redundant description is omitted or simplified.

Embodiment 1

A display device according to Embodiment 1 and a method for checking the display device will be described.

[1-1. Whole Configuration of Display Device]

First, a whole configuration of a display device according to this embodiment will be described with reference to FIG. 1.

Figure 1:
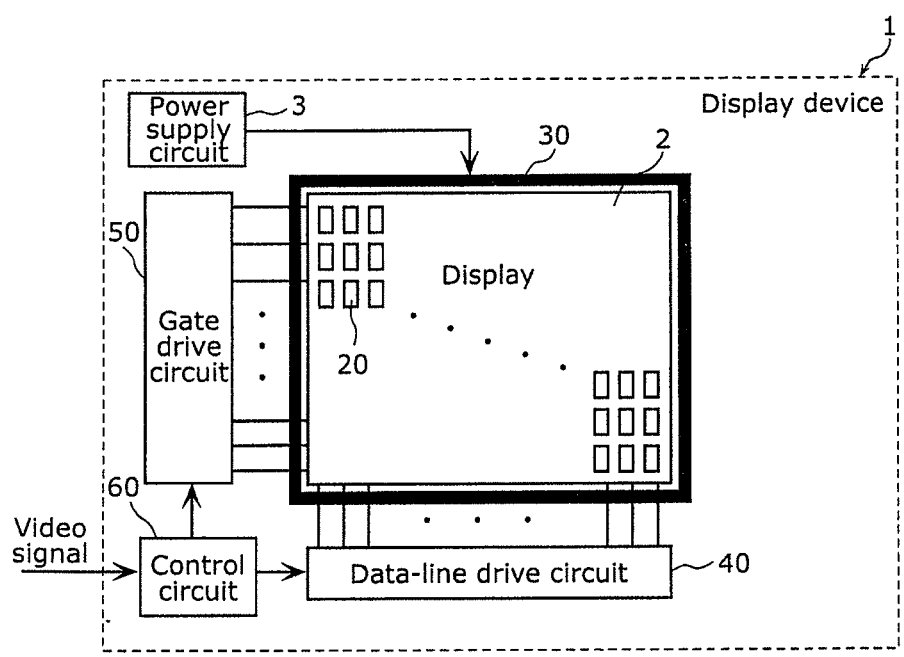
FIG. 1 is a functional block diagram illustrating a whole configuration of a display device according to Embodiment 1.

FIG. 1 is a functional block diagram illustrating a whole configuration of a display device 1 according to the embodiment.

A display device 1 according to the embodiment is a device which displays an image based on a video signal. As illustrated in FIG. 1, the display device 1 includes, as functions, a display 2, a power supply circuit 3, a data-line drive circuit 40, a gate drive circuit 50, and a control circuit 60.

The display 2 is a display panel in which a plurality of pixel circuits 20 each of which includes a light emitting element and a circuit element for driving the light emitting element to emit light are arranged in a matrix. Luminance of the light emitting element changes according to a current supplied to the emitting element. As the light emitting element, for example, an organic electroluminescent (EL) element, a micro light-emitting diode (LED) element, and the like can be used.

The power supply circuit 3 is a circuit which outputs a power supply voltage to be supplied to the display panel (not illustrated in FIG. 1) which includes the plurality of the pixel circuits 20. The power supply circuit 3 supplies a power supply voltage to each of the plurality of the pixel circuits 20 through a feeder 30 disposed along an outer periphery of the display 2. Note that the feeder 30 includes a plurality of power supply lines each of which supplies a different voltage to each of the plurality of the pixel circuits 20. In this embodiment, the power supply circuit 3 is realized by an integrated circuit (IC) chip.

The control circuit 60 is a circuit which supplies, to the display panel, a gradation signal corresponding to a video signal that is input. In this embodiment, the control circuit 60 controls the data-line drive circuit 40 and the gate drive circuit 50. The control circuit 60 generates, based on a video signal externally input, a gradation signal corresponding to the luminance of each of the plurality of the light emitting elements, and outputs the gradation signal that is generated to the data-line drive circuit 40.

In addition, the control circuit 60 generates, based on a synchronized signal that is input, a control signal for controlling the gate drive circuit 50, and outputs the control signal that is generated to the data-line drive circuit 40 and the gate drive circuit 50. Specifically, the control circuit 60 includes a central processing unit (CPU) and a timing controller. In the control circuit 60, the CPU controls the timing controller based on the synchronized signal input for the timing controller to output the control signal to the data-line drive circuit 40 and the gate drive circuit 50. In this embodiment, the control circuit 60 is realized by an IC chip.

The data-line drive circuit 40 drives a data line of the display 2 based on a gradation signal generated in the control circuit 60. More specifically, the data-line drive circuit 40 outputs, based on a video signal and a horizontal synchronizing signal, a video signal voltage (data voltage) which has reflected the video signal to each of the plurality of the pixel circuits 20.

The gate drive circuit 50 drives a scan line of the display 2 based on a control signal generated in the control circuit 60, for example. More specifically, the gate drive circuit 50 outputs, based on a vertical synchronizing signal and a horizontal synchronizing signal, a scan signal and the like to each of the plurality of the pixel circuits 20 per at least display line.

[1-2. Circuit Board]

Figure 2:
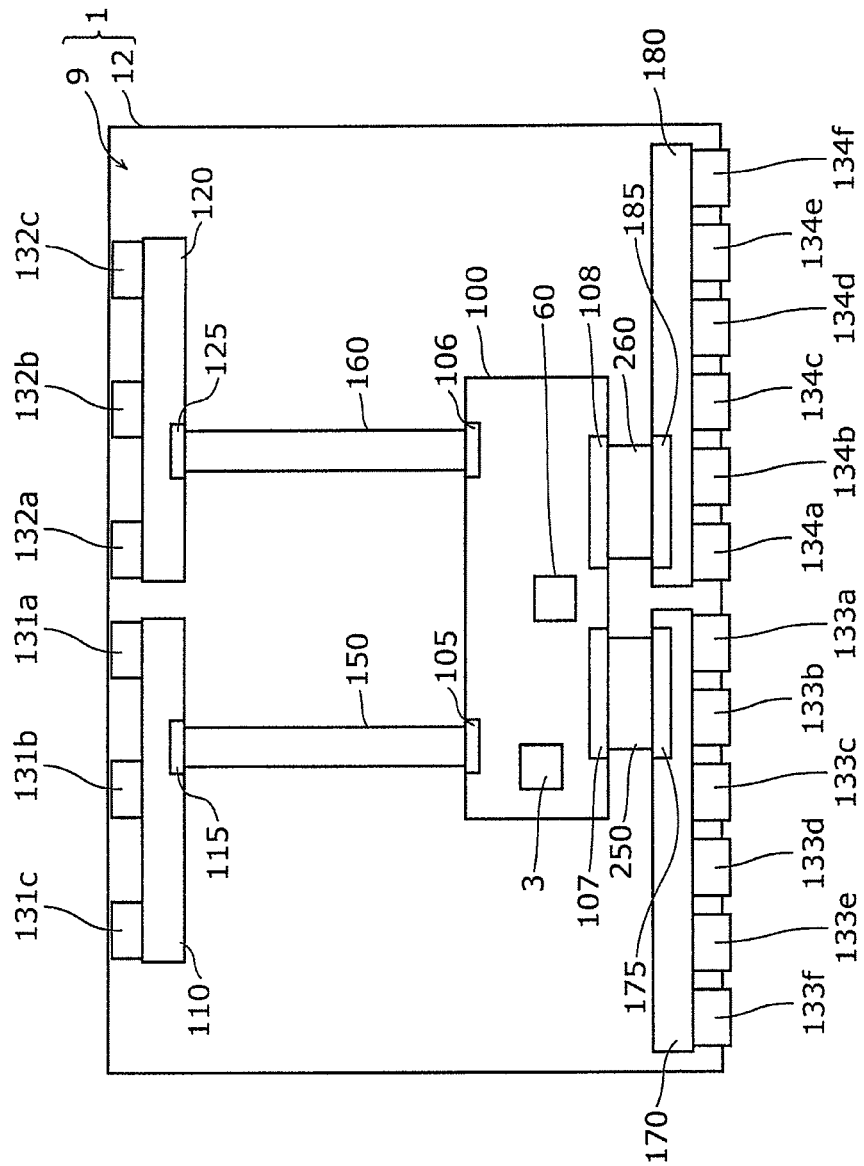
FIG. 2 is a schematic diagram illustrating a configuration of a circuit board of the display device according to Embodiment 1.
Figure 3:
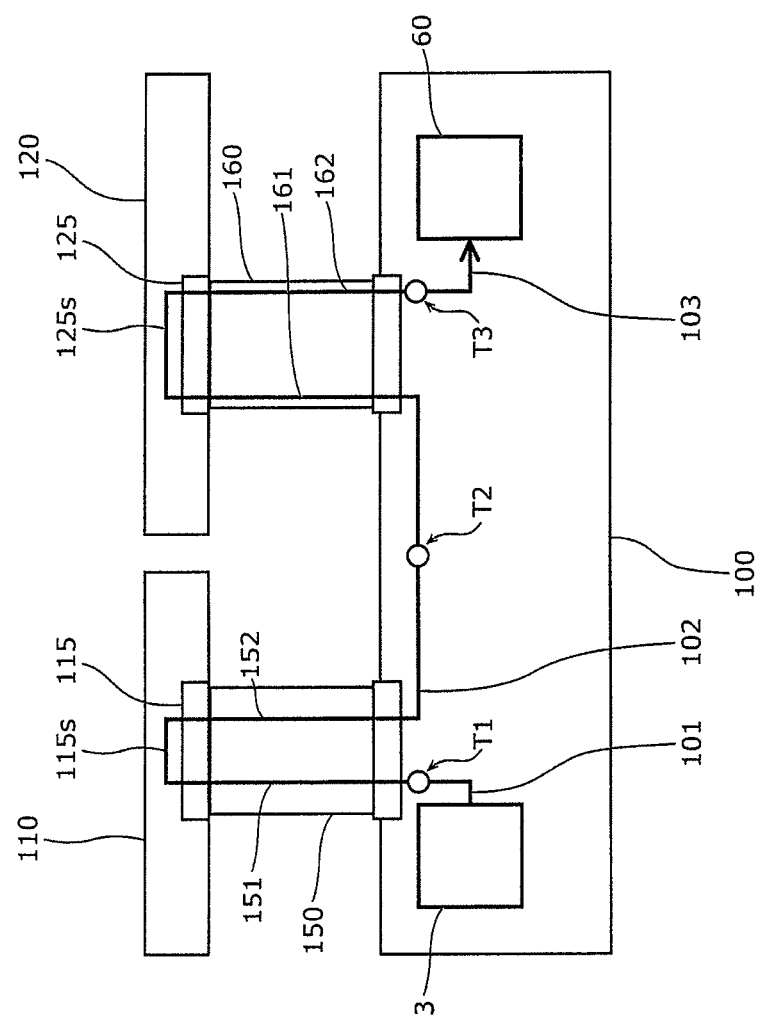
FIG. 3 is a schematic diagram illustrating a main wiring board, a first wiring board, a second wiring board, a first cable, and a second cable according to Embodiment 1.

A circuit board which is included in the display device 1 according to the embodiment will be described with reference to FIG. 2 and FIG. 3. FIG. 2 is a schematic diagram illustrating a configuration of a circuit board 9 of the display device 1 according to the embodiment. FIG. 2 illustrates the back side of the display surface of the display device 1. FIG. 3 is a schematic diagram illustrating a main wiring board 100, a first wiring board 110, a second wiring board 120, a first cable 150, and a second cable 160 according to the embodiment.

As illustrated in FIG. 2, the display device 1 according to the embodiment includes, as a structure, the circuit board 9 and a display panel 12.

The display panel 12 includes the plurality of pixel circuits 20 illustrated in FIG. 1. In this embodiment, the display panel 12 includes the display 2, the data-line drive circuit 40, and the gate drive circuit 50 which are illustrated in FIG. 1.

The circuit board 9 is a board which supplies a power supply voltage and the like to the display panel 12 that includes the plurality of pixel circuits 20. As illustrated in FIG. 2, the circuit board 9 includes a main wiring board 100, a first wiring board 110, a second wiring board 120, a first cable 150, and a second cable 160. In the embodiment, the circuit board 9 further includes a third cable 250, a fourth cable 260, a third wiring board 170, a fourth wiring board 180, first connection boards 131a to 131c, second connection boards 132a to 132c, third connection boards 133a to 133f, and fourth connection boards 134a to 134f.

As illustrated in FIG. 3, the main wiring board 100 is a board which includes a first output line 101, a relay line 102, a first input line 103, a power supply circuit 3, and a control circuit 60. In this embodiment, the main wiring board 100 is realized by a printed circuit board, and includes two integrated circuit (IC) chips. One of the IC chips corresponds to the power supply circuit 3 and the other of the IC chips corresponds to the control circuit 60. The power supply circuit 3 is connected with the first output line 101. The first output line 101 is connected with, for example, an output port of the power supply circuit 3. In the embodiment, the power supply circuit 3 is an example of a first circuit which outputs a first voltage to the first output line 101. Here, the first voltage is not particularly limited. The first voltage may be a power supply voltage or a signal voltage which corresponds to a signal for communication. In the embodiment, the first voltage is a status signal which indicates the state of the power supply circuit 3. The control circuit 60 is connected with the first input line 103. The first input line 103 is connected with, for example, an input port of the control circuit 60.

The main wiring board 100 includes connectors 105, 106, 107, and 108 with which the first cable 150, the second cable 160, the third cable 250, and the fourth cable 260 are connected, respectively. Note that, although not illustrated, the main wiring board 100 further includes a power supply IC or the like which supplies power to another line, another sensor, and the control circuit 60.

The first wiring board 110 is a board which includes a line to which a power supply voltage is applied. In the embodiment, the first wiring board 110 is realized by a printed circuit board, and includes a connector 115. The first cable 150 is connected with the connector 115. In addition, as illustrated in FIG. 3, the first wiring board 110 includes a first feedback line 115s. In the embodiment, the first feedback line 115s is a line which short-circuits two terminals of the connector 115. The first wiring board 110 may include another line different from the first feedback line 115s printed on the first wiring board 110.

The second wiring board 120 is a board which includes a line to which a power supply voltage is applied. In the embodiment, the second wiring board 120 is realized by a printed circuit board, and includes a connector 125. The connector 125 is connected with the second cable 160. In addition, as illustrated in FIG. 3, the second wiring board 120 includes a second feedback line 125s. In the embodiment, the second feedback line 125s is a line which short-circuits two terminals of the connector 125. The second wiring board 120 may include another line different from the second feedback line 125s printed on the second wiring board 120.

The first cable 150 is a cable removably coupled to the main wiring board 100 and the first wiring board 110. The first cable 150 may be a flexible (that is, having flexibility), flat plate-shaped cable which includes a plurality of conductors that form the core line of the first cable 150. The first cable 150 includes, as illustrated in FIG. 3, a first forward conductor 151 which directly or indirectly connects the first output line 101 and the first feedback line 115s, and a first return conductor 152 which directly or indirectly connects the first input line 103 and the first feedback line 115s. In the embodiment, the first return conductor 152 indirectly connects the first input line 103 and the first feedback line 115s via the relay line 102 and the like. The first cable 150 is realized by, for example, a flexible flat cable (FFC).

The second cable 160 is a cable removably coupled to the main wiring board 100 and the second wiring board 120. The second cable 160 may be a flexible, flat plate-shaped cable which includes a plurality of conductors that form the core line of the second cable 160. In the embodiment, the second cable 160 includes, as illustrated in FIG. 3, a second forward conductor 161 which directly or indirectly connects the relay line 102 and the second feedback line 125s, and a second return conductor 162 which directly or indirectly connects the first input line 103 and the second feedback line 125s. The second cable 160 is realized by, for example, an FFC.

The first connection boards 131a to 131c are wiring boards which connect the first wiring board 110 and the display panel 12. The first connection boards 131a to 131c may be flexible, flat plate-shaped boards each of which includes a plurality of conductors that form the core line of the board. The first connection boards 131a to 131c are realized by, for example, flexible printed circuits (FPCs). The first connection boards 131a to 131c are connected with the first wiring board 110 and the display panel 12 using, for example, anisotropic electric conduction films (ACFs).

The second connection boards 132a to 132c are wiring boards which connect the second wiring board 120 and the display panel 12. The second connection boards 132a to 132c may be flexible, flat plate-shaped boards each of which includes a plurality of conductors that form the core line of the board. The second connection boards 132a to 132c are realized by, for example, FPCs. The second connection boards 132a to 132c are connected with the second wiring board 120 and the display panel 12 using, for example, ACFs.

The third cable 250 is a cable which is removably coupled to the main wiring board 100 and the third wiring board 170, and to which a gradation signal which the control circuit 60 outputs is applied. In addition, a control signal which the control circuit 60 outputs may be applied to the third cable 250. The third cable 250 may be a flexible, flat plate-shaped cable which includes a plurality of conductors that form the core line of the third cable 250. The third cable 250 is realized by, for example, an FFC.

The fourth cable 260 is a cable which is removably coupled to the main wiring board 100 and the fourth wiring board 180, and to which a gradation signal which the control circuit 60 outputs is applied. In addition, a control signal which the control circuit 60 outputs may be applied to the fourth cable 260. The fourth cable 260 may be a flexible, flat plate-shaped cable which includes a plurality of conductors that form the core line of the fourth cable 260. The fourth cable 260 is realized by, for example, an FFC.

The third wiring board 170 is a board to which a gradation signal is applied. A control signal may be applied to the third wiring board 170. In the embodiment, the third wiring board 170 is realized by a printed circuit board, and includes a connector 175. The connector 175 is connected with the third cable 250.

The fourth wiring board 180 is a board to which a gradation signal is applied. A control signal may be applied to the fourth wiring board 180. In the embodiment, the fourth wiring board 180 is realized by a printed circuit board, and includes a connector 185. The connector 185 is connected with the fourth cable 260.

The third connection boards 133a to 133f are flexible wiring boards which connect the third wiring board 170 and the display panel 12. The third connection boards 133a to 133f may be flexible, flat plate-shaped boards each of which includes a plurality of conductors that form the core line of the board. The third connection boards 133a to 133f are realized by, for example, FPCs. The third connection boards 133a to 133f are connected with the third wiring board 170 and the display panel 12 using, for example, ACFs.

The fourth connection boards 134a to 134f are flexible wiring boards which connect the fourth wiring board 180 and the display panel 12. The fourth connection boards 134a to 134f may be flexible, flat plate-shaped boards each of which includes a plurality of conductors that form the core line of the board. The fourth connection boards 134a to 134f are realized by, for example, FPCs. The fourth connection boards 134a to 134f are connected with the fourth wiring board 180 and the display panel 12 using, for example, ACFs.

[1-3. Operation]

Next, operation of the display device 1 according to the embodiment will be described.

The control circuit 60 included in the display device 1 according to the embodiment controls the display panel 12 by supplying a gradation signal and a control signal to the display panel 12. Before the control circuit 60 starts a display on the display panel 12, the control circuit 60 checks if circuits around the control circuit 60, such as the power supply circuit 3, are operating normally. When a supply of power to the display device 1 starts, the power is supplied to each circuit, such as the power supply circuit 3 included in the circuit board 9. Each circuit outputs, to the control circuit 60, a status signal which indicates that each circuit is supplied with the power and is properly operating. When the control circuit 60 confirms that each circuit is properly operating based on the status signal, the control circuit 60 starts a display on the display panel 12. When the control circuit 60 confirms that even one circuit has not output a predetermined status signal, the control circuit 60 will not start a display on the display panel 12. In this case, the control circuit 60 may notify an anomaly of a circuit by outputting, for example, a signal indicating the anomaly of the circuit.

In the embodiment, the connection failure of each of the first cable 150 and the second cable 160 is detected using a first voltage which is an example of a status signal output by the power supply circuit 3. As illustrated in FIG. 3, a first voltage that the power supply circuit 3 outputs is input to the control circuit 60 via the first output line 101, the first forward conductor 151, the first feedback line 115s, the first return conductor 152, the relay line 102, the second forward conductor 161, the second feedback line 125s, the second return conductor 162, and the first input line 103. Accordingly, even when the power supply circuit 3a is properly outputting a first voltage, the first voltage is not input to the control circuit 60 when at least one of the first cable 150 and the second cable 160 is not properly connected. Since the control circuit 60 cannot confirm that the power supply circuit 3 is outputting a status signal, the control circuit 60 will not start a display on the display panel 12. Therefore, when the display device 1 is checked, the connection failure of each of the first cable 150 and the second cable 160 can be promptly detected. In addition, in the embodiment, the main wiring board 100 includes terminals T1, T2, and T3 which are connected with the first output line 101, the relay line 102, and the first input line 103, respectively. Accordingly, a place where an anomaly is present is readily detectable by checking a voltage in each terminal or electrical connection between the terminals.

Figure 4:
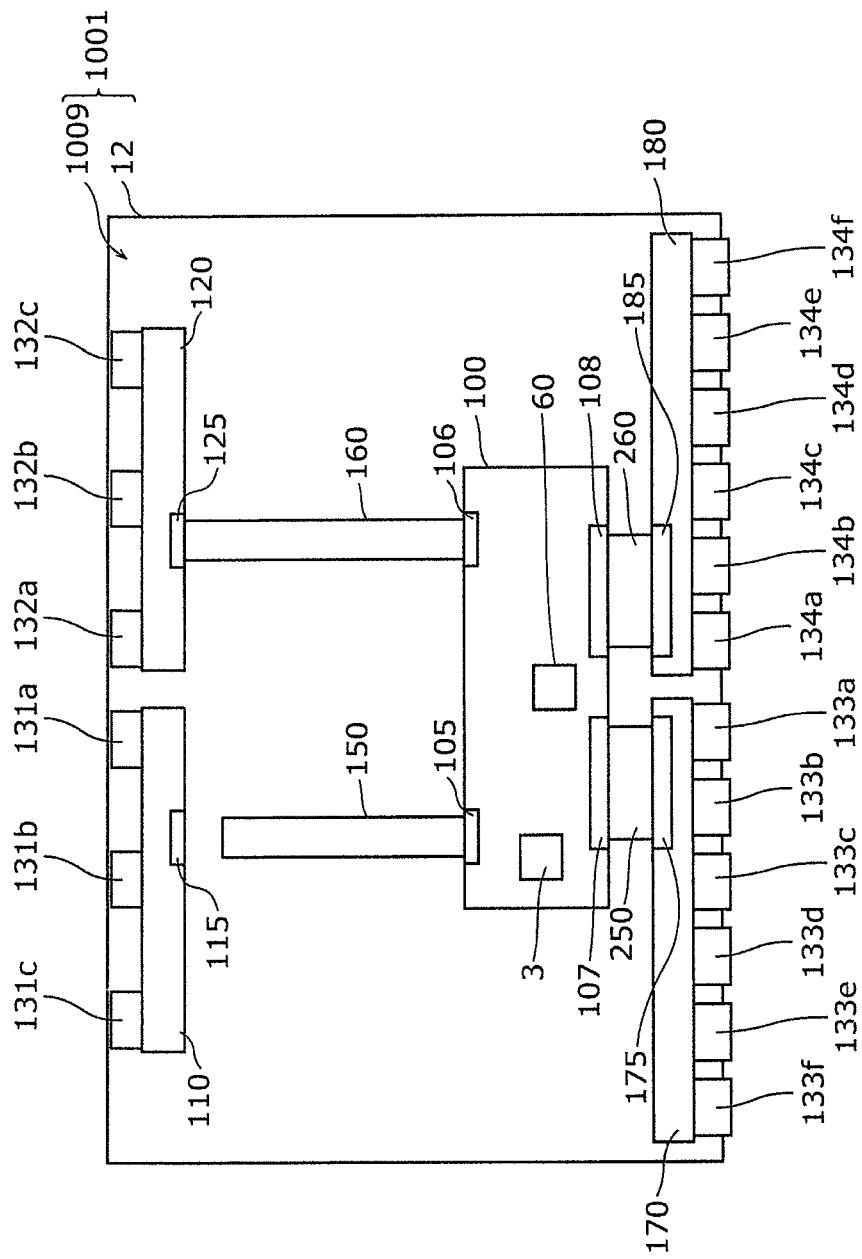
FIG. 4 is a schematic diagram illustrating a configuration of a circuit board of a display device according to a comparative example.

Here, an advantageous effect of the display device 1 according to the embodiment will be described using a display device according to a comparative example. FIG. 4 is a schematic diagram illustrating a configuration of a circuit board 1009 of a display device 1001 according to a comparative example. FIG. 4 illustrates the back side of the display surface of the display device 1001. Note that, FIG. 4 illustrates a state in which a first cable 150 and a first wiring board 110 are not properly connected in the display device 1001. Operation of the circuit board 1009 illustrated in FIG. 4 and the operation of the circuit board 9 according to Embodiment 1 are the same, except that a status signal output by a power supply circuit 3 is directly output to a control circuit 60 included in a main wiring board 100.

Figure 5:
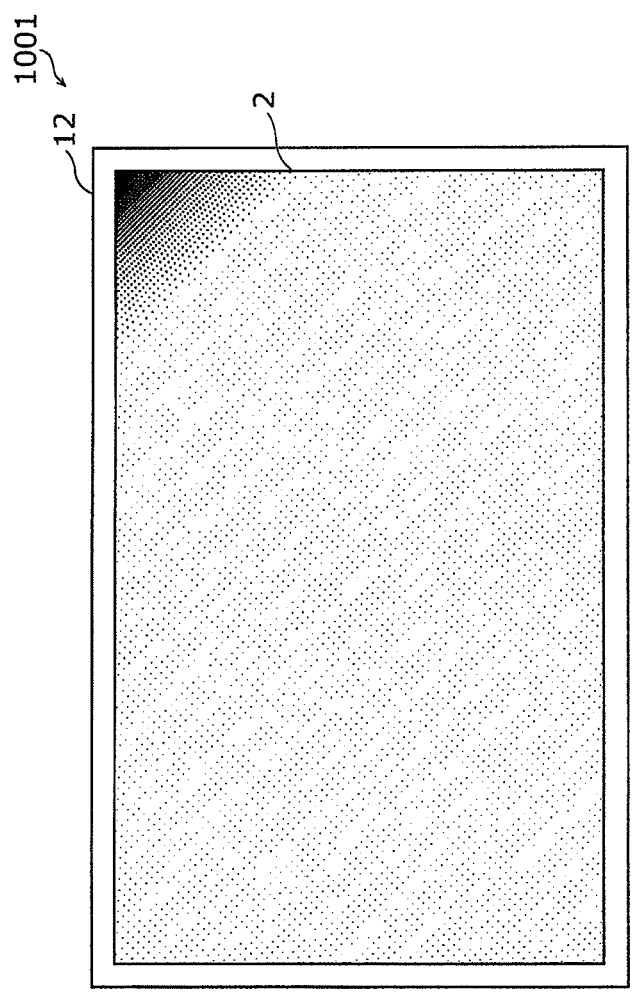
FIG. 5 is a schematic diagram illustrating an example of a display on a display panel of the display device according to the comparative example.

Operation of such display device 1001 which has the connection failure of the first cable 150 as illustrated in FIG. 4 will be described with reference to FIG. 5. FIG. 5 is a schematic diagram illustrating an example of a display on a display panel 12 of the display device 1001 according to the comparative example. FIG. 5 illustrates a display state of the display panel 12 when the first cable 150 and the first wiring board 110 are not properly connected as illustrated in FIG. 4.

When the connection failure of the first cable 150 is found as illustrated in FIG. 4, a power supply voltage cannot be applied, via the first cable 150, to each pixel circuit 20 included in the display panel 12 which is arranged on the first wiring board 110-side. However, a power supply voltage is supplied to each pixel circuit 20 via a second cable 160 and a feeder 30. Here, since resistance present in the feeder 30 is typically large, the voltage of the power supply voltage supplied to each pixel circuit 20 is lower than the voltage of a proper power supply voltage. Accordingly, as illustrated in FIG. 5, the luminance of some of the pixel circuits 20 included in the display panel 12 which are arranged on the first wiring board 110-side is lower than the luminance of the other pixel circuits 20. As such, although the luminance of some of the pixel circuits 20 decreases, there may be a case where an anomaly is not immediately detectable by merely visually checking the display state of the display panel 12.

On the other hand, in the display device 1 according to the embodiment, the control circuit 60 determines whether a first voltage is input, and when an input of the first voltage is determined, starts a display on the display panel 12. Conversely, when the control circuit 60 determines that there is no first voltage input, the control circuit 60 will not start a display on the display panel 12. That is to say, when the connection failure is found in at least one of the first cable 150 and the second cable 160, the control circuit 60 will not start a display on the display panel 12. Accordingly, the connection failure of each of the first cable 150 and the second cable 160 is readily detectable.

[1-4. Method for Checking Display Device]

Figure 6:
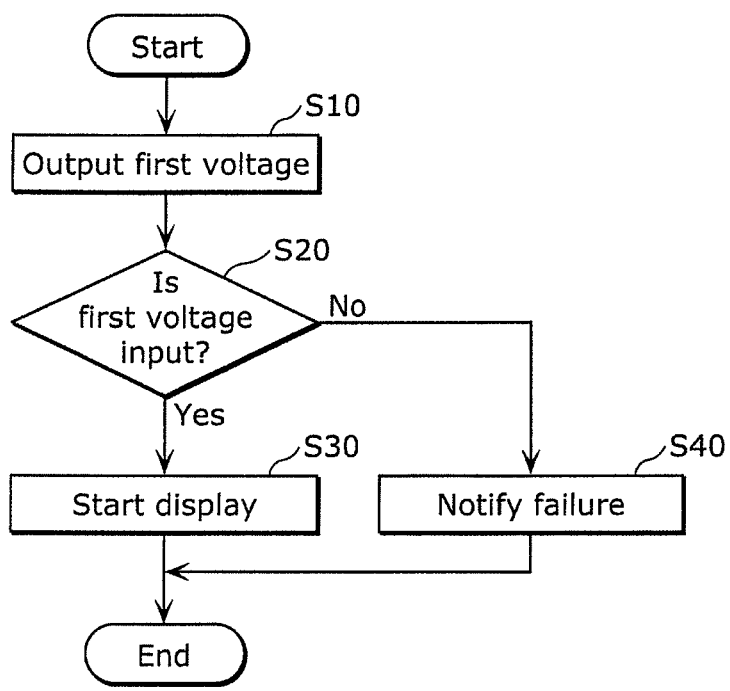
FIG. 6 is a flowchart illustrating a method for checking the display device according to Embodiment 1.

Next, a method for checking the display device 1 according to the embodiment will be described with reference to FIG. 6. FIG. 6 is a flowchart illustrating a method for checking the display device 1 according to the embodiment.

Firstly, as illustrated in FIG. 6, the power supply circuit 3 included in the display device 1 outputs a first voltage (S10). Specifically, the power supply circuit 3 outputs the first voltage as a status signal when, for example, power is supplied to the display device 1.

Next, the control circuit 60 determines whether the first voltage is input to the control circuit 60 (S20). When the control circuit 60 determines that the first voltage is input (Yes in S20), the control circuit 60 starts a display on the display panel 12 (S30). Note that, before the control circuit 60 starts the display, the control circuit 60 may determine the presence of a status signal in another circuit. When the control circuit 60 determines that there is no first voltage input (No in S20), the control circuit 60 determines that there is an occurrence of a connection failure in one of the first cable 150 and the second cable 160, and notify the failure without starting a display on the display panel 12 (S40). In this case, the control circuit 60 may output, for example, a signal which indicates the failure. Note that when there is no first voltage input, an anomaly may be found in the power supply circuit 3. In such cases, the detection of a voltage or the like from each of the terminals T1 to T3 which are illustrated in FIG. 3 makes it possible to determine whether it is an anomaly of the power supply circuit 3 or the connection failure of each of the cables.

As such, according to the method for checking the display device 1 according to the embodiment, the connection failure of each of the first cable 150 and the second cable 160 is readily detectable.

[1-5. Detailed Configuration of First Cable and Second Cable]

Figure 7:
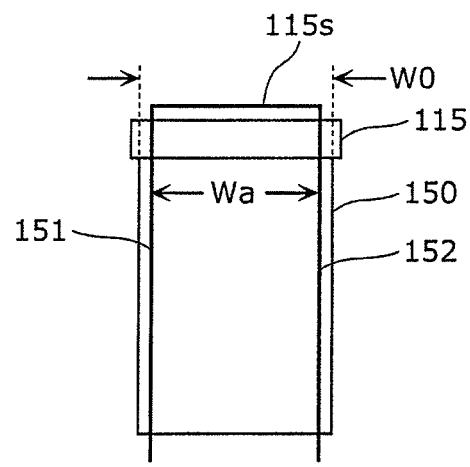
FIG. 7 is a schematic diagram illustrating a detailed configuration of the first cable according to Embodiment 1.

Next, the detailed configuration of each of the first cable 150 and the second cable 160 according to the embodiment will be described with reference to FIG. 7. FIG. 7 is a schematic diagram illustrating the detailed configuration of the first cable 150 according to the embodiment.

As illustrated in FIG. 7, in the first cable 150 according to the embodiment, the first forward conductor 151 and the first return conductor 152 are spaced apart from each other at an end portion of the first cable 150 by at least half a width W0 of the first cable 150 at the end portion. In the example illustrated in FIG. 7, a space Wa between the first forward conductor 151 and the first return conductor 152 is at least half the width W0. That is to say, a relation between the space Wa and the width W0 can be expressed by Wa≥W0/2.

Figure 8:
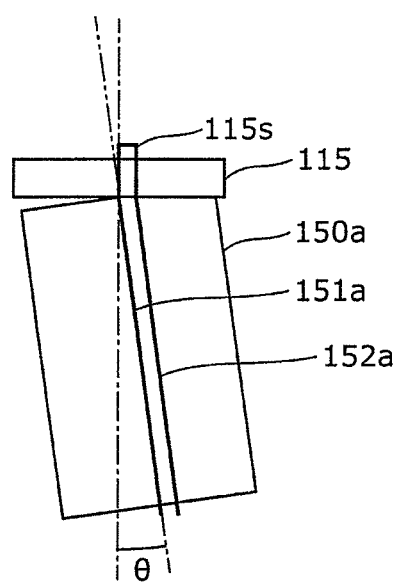
FIG. 8 is a schematic diagram illustrating a state when a connection failure of a first cable according to comparative example 1 occurs.
Figure 9:
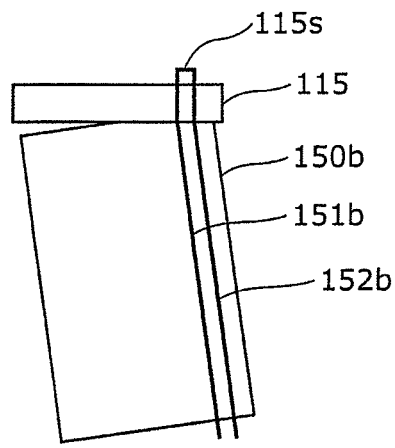
FIG. 9 is a schematic diagram illustrating a state when a connection failure of a first cable according to comparative example 2 occurs.
Figure 10:
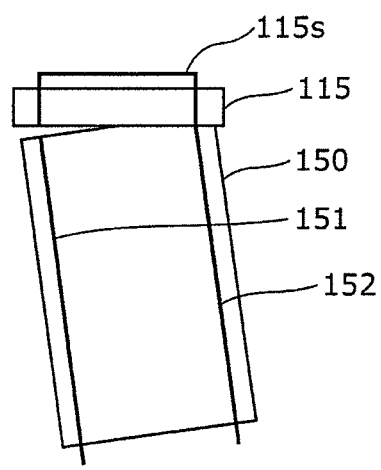
FIG. 10 is a schematic diagram illustrating a state when a connection failure of the first cable according to Embodiment 1 occurs.

An advantageous effect of this configuration will be described with reference to FIG. 8 through FIG. 10. FIG. 8 is a schematic diagram illustrating a state when a connection failure of a first cable 150a according to comparative example 1 occurs. FIG. 9 is a schematic diagram illustrating a state when a connection failure of a first cable 150b according to comparative example 2 occurs. FIG. 10 is a schematic diagram illustrating a state when a connection failure of the first cable 150 according to the embodiment occurs.

The first cable 150a according to comparative example 1 illustrated in FIG. 8 includes, like the first cable 150 according to the embodiment, a first forward conductor 151a and a first return conductor 152a. However, the first cable 150a according to comparative example 1 has a space between the first forward conductor 151a and the first return conductor 152a which is narrower than the space between the first forward conductor 151 and the first return conductor 152, and in this respect, the first cable 150a according to comparative example 1 is different from the first cable 150 according to the embodiment.

In such first cable 150a according to comparative example 1 as illustrated in FIG. 8, when the first cable 150a is obliquely inserted into a connector 115 at an angle of θ, electrical connection between the first forward conductor 151a and a first feedback line 115s and between the first return conductor 152a and the first feedback line 115s may be maintained. Accordingly, there is a possibility that a display device 1 which uses such first cable 150a may not be able to detect the connection failure.

The first cable 150b according to comparative example 2 illustrated in FIG. 9 includes, like the first cable 150 according to the embodiment, a first forward conductor 151b and a first return conductor 152b. However, like the first cable 150a according to comparative example 1, the first cable 150b according to comparative example 2 has a space between the first forward conductor 151b and the first return conductor 152b which is narrower than the space between the first forward conductor 151 and the first return conductor 152, and in this respect, the first cable 150b according to comparative example 2 is different from the first cable 150 according to the embodiment. Furthermore, in the first cable 150b according to comparative example 2, the first forward conductor 151b and the first return conductor 152b are disposed near an edge of the first cable 150b in the widthwise direction.

In such first cable 150b according to comparative example 2, when the first cable 150b is obliquely inserted into a connector 115 like the first cable 150a according to comparative example 1, as illustrated in FIG. 9, electrical connection between the first forward conductor 151b and a first feedback line 115s and between the first return conductor 152b and the first feedback line 115s may be maintained. Accordingly, there is a possibility that a display device 1 which uses such first cable 150b may not be able to detect the connection failure.

As opposed to the comparative examples described above, in the first cable 150 according to the embodiment as illustrated in FIG. 10, when the first cable 150 is obliquely inserted into the connector 115, electrical connection between the first feedback line 115s and the first forward conductor 151 and between the first feedback line 115s and the first return conductor 152 can be more assuredly disconnected. Therefore, it is possible for the first cable 150 according to the embodiment to more assuredly detect the connection failure.

Note that the first cable 150 may include a connector at an end portion of the first cable 150. In this case, the width W0 of the first cable 150 at the end portion may be the width of the connector.

Although the first cable 150 has been described above, the second cable 160 has same configuration as the first cable 150.

Embodiment 2

A display device and a method for checking the display device according to Embodiment 2 will be described. In the embodiment, a circuit different from a power supply circuit 3 is also used for detecting the connection failure of a cable. Hereinafter, the display device and the method for checking the display device according to the embodiment will be described with particular emphasis on differences with Embodiment 1.

[2-1. Circuit Board]

Figure 11:
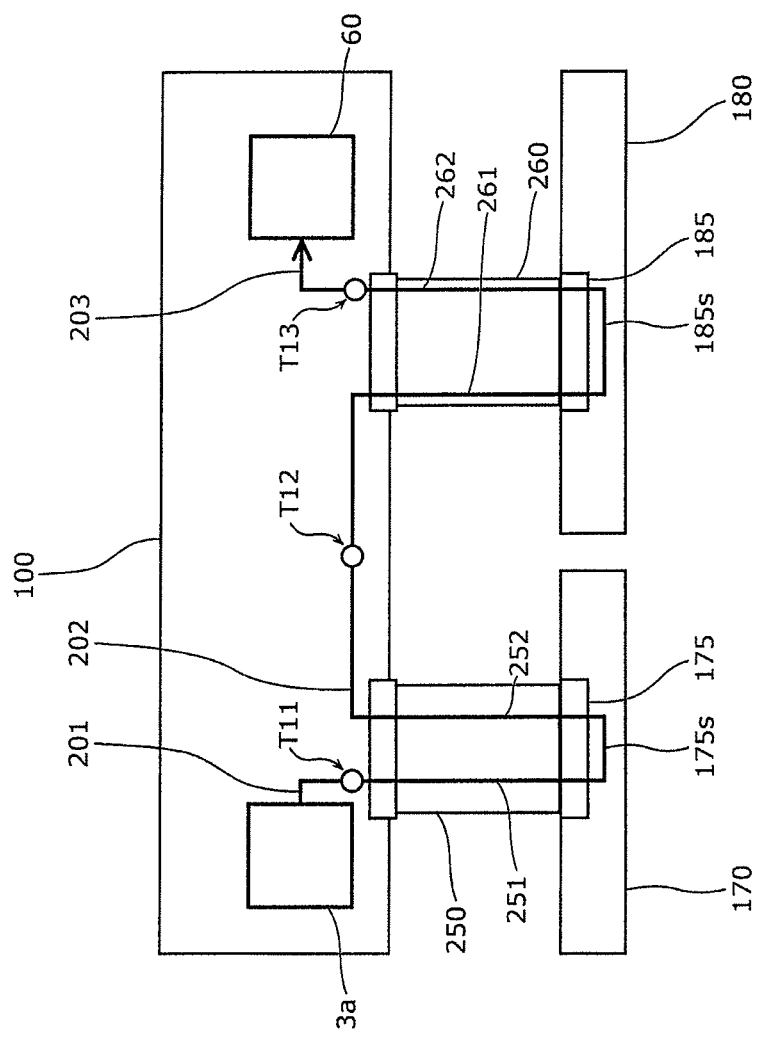
FIG. 11 is a schematic diagram illustrating a main wiring board, a third wiring board, a fourth wiring board, a third cable, and a fourth cable according to Embodiment 2.

A circuit board which is included in the display device according to the embodiment will be described with reference to FIG. 11. FIG. 11 is a schematic diagram illustrating a main wiring board 100, a third wiring board 170, a fourth wiring board 180, a third cable 250, and a fourth cable 260, according to the embodiment.

As illustrated in FIG. 11, the main wiring board 100 according to the embodiment further includes a second output line 201, a relay line 202, a second input line 203, and a second circuit 3a that outputs a second voltage to the second output line 201.

The second circuit 3a is not particularly limited so long as it is a circuit that outputs a second voltage before a display starts on a display panel 12. For example, a power supply IC, a sensor, or the like can be used as the second circuit 3a. Here, the second voltage is not particularly limited. The second voltage may be a power supply voltage or a signal voltage which corresponds to a signal for communication. In the embodiment, the second voltage is a status signal which indicates the state of the power supply circuit 3a.

A control circuit 60 is connected with the second input line 203. The second input line 203 is connected with, for example, a port among input ports included in the control circuit 60 which is different from a port with which the first input line 103 is connected.

The third wiring board 170 includes a third feedback line 175s, and the fourth wiring board 180 includes a fourth feedback line 185s.

The third cable 250 includes a third forward conductor 251 which directly or indirectly connects the second output line 201 and the third feedback line 175s, and a third return conductor 252 which directly or indirectly connects the second input line 203 and the third feedback line 175s. In the embodiment, the third return conductor 252 indirectly connects the second input line 203 and the third feedback line via the relay line 202 and the like.

The fourth cable 260 includes a fourth forward conductor 261 which directly or indirectly connects the relay line 202 and the fourth feedback line 185s, and a fourth return conductor 262 which directly or indirectly connects the second input line 203 and the fourth feedback line 185s.

[2-2. Operation]

Next, operation of the display device according to the embodiment will be described.

In the embodiment, the connection failure of each of the third cable 250 and the fourth cable 260 is detected using a second voltage that the second circuit 3a outputs. As illustrated in FIG. 11, a second voltage that the second circuit 3a outputs is input to the control circuit 60 via the second output line 201, the third forward conductor 251, the third feedback line 175s, the third return conductor 252, the relay line 202, the fourth forward conductor 261, the fourth feedback line 185s, the fourth return conductor 262, and the second input line 203. Accordingly, even when the second circuit 3a is properly outputting a second voltage, the second voltage is not input to the control circuit 60 when at least one of the third cable 150 and the fourth cable 160 is not properly connected. Since the control circuit 60 cannot confirm that the second circuit 3a is outputting a status signal, the control circuit 60 will not start a display on the display panel 12. Therefore, the connection failure of each of the third cable 250 and the fourth cable 260 can be promptly detected when a display device 1 is checked. In addition, in the embodiment, the main wiring board 100 includes terminals T11, T12, and T13 which are connected with the second output line 201, the relay line 202, and the second input line 203, respectively. Accordingly, a place where a failure is present is readily detectable by checking a voltage in each terminal or electrical connection between the terminals.

[2-3. Method for Checking Display Device]

Figure 12:
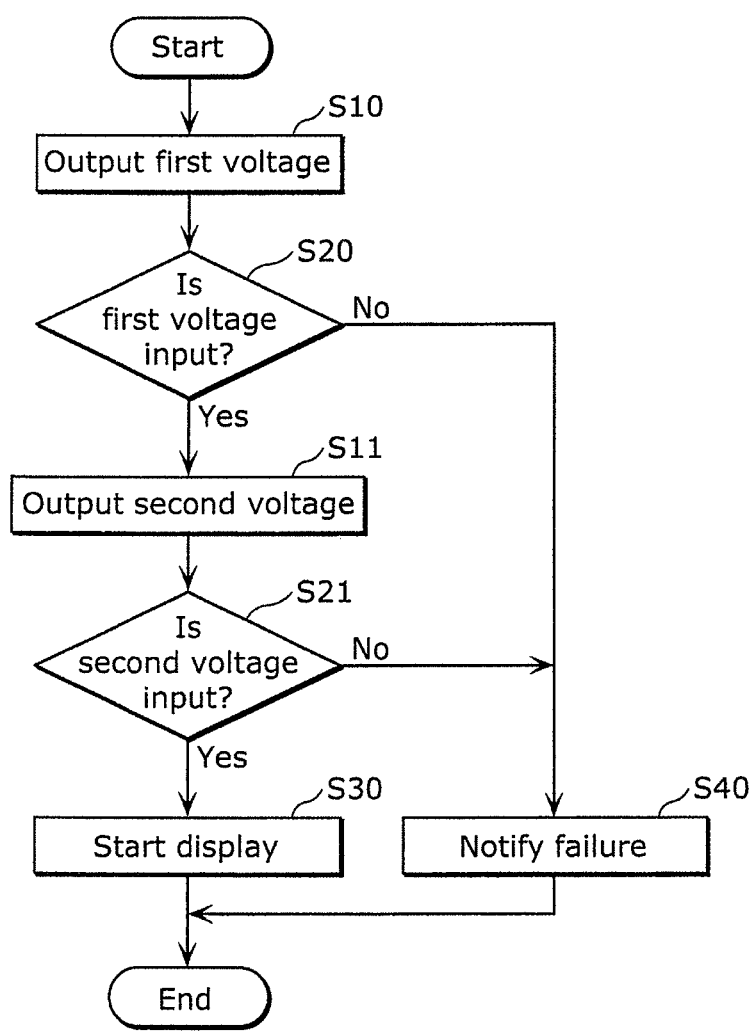
FIG. 12 is a flowchart illustrating a method for checking a display device according to Embodiment 2.

Next, a method for checking the display device according to the embodiment will be described with reference to FIG. 12. FIG. 12 is a flowchart illustrating a method for checking a display device according to the embodiment.

Since steps S10 and S20 illustrated in FIG. 12 are the same steps described in Embodiment 1, descriptions of these steps will be omitted.

In step S20 in the embodiment, when the control circuit 60 determines that a first voltage is input (Yes in S20), the second circuit 3a outputs a second voltage (S11). Note that the timing at which the second circuit 3a outputs the second voltage is not limited as described above, and the second circuit 3a may output the second voltage before step S20.

Next, the control circuit 60 determines whether the second voltage is input to the control circuit 60 (S21). When the control circuit 60 determines that the second voltage is input (Yes in S21), the control circuit 60 starts a display on the display panel 12 (S30). On the other hand, when the control circuit 60 determines that there is no second voltage input (No in S21), the control circuit 60 determines that there is an occurrence of the connection failure in at least one of the third cable 250 and the fourth cable 260, and notify the failure without starting a display on the display panel 12 (S40). In this case, the control circuit 60 may output, for example, a signal which indicates the failure. Note that when there is no second voltage input, an anomaly may be found in the second circuit 3a. For example, the detection of a voltage or the like from each of the terminals T11 to T13 which are illustrated in FIG. 11 makes it possible to determine whether it is an anomaly of the second circuit 3a or the connection failure of each of the cables.

As such, according to the method for checking the display device according to the embodiment, the connection failure of each of the third cable 250 and the fourth cable 260 is readily detectable.

Other Variations, Etc.

The display device and the method for checking the display device according to the present disclosure have been described based on the exemplary embodiments. However, the display device and the method for checking the display device according to the present disclosure are not limited to these exemplary embodiments. A different embodiment achieved by combining optional elements according to the exemplary embodiments, a variation obtained, without departing from the scope of the present disclosure, by making to the embodiments various modifications which may be conceived by a person skilled in the art, and various devices that includes the display device according to the exemplary embodiments are also included in the present disclosure.

Figure 13:
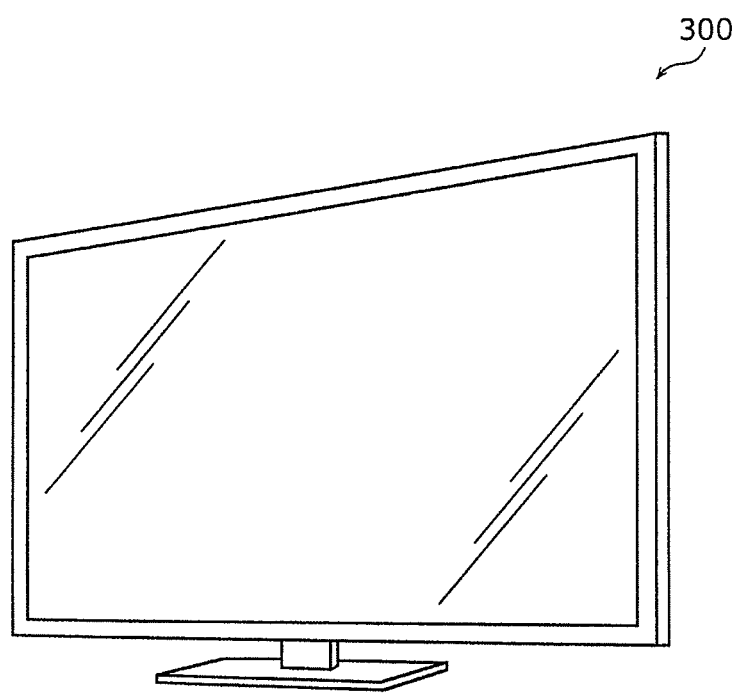
FIG. 13 is a diagram illustrating an external appearance of a thin flat screen TV that includes the display device according to the embodiments.

For example, the display device according to the above-described embodiments is included in a thin flat TV 300 as illustrated in FIG. 13. With the display device according to the above-described embodiments, a thin flat TV which can readily detect the connection failure of a cable can be realized.

In addition, the configuration of the first forward conductor 151 and the first return conductor 152 being spaced apart from each other at an end portion of the first cable 150 according to the above Embodiment 1 may be applied to the configuration of the third cable 250 and the fourth cable 260 according to the above Embodiment 2.

Furthermore, in Embodiment 2 above, a first voltage which is output from the power supply circuit 3 according to Embodiment 1 above may be output to the second output line 201, instead of a second voltage.

In addition, although the circuit board includes the first wiring board 110 and the second wiring board 120 in the above-described embodiments, the number of wiring board which supplies a power supply voltage to the display panel 12 is not limited to the two wiring boards. The number of the wiring board may be three or more. In this case, the circuit board may include three or more cables each of which connects the main wiring board 100 and each wiring board.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for an organic EL flat-panel display, and particularly suitable for use in a large-sized display.

The invention claimed is:

1. A display device, comprising:
a display panel;
a main wiring board;
a first wiring board that includes a first feedback line; and
a first cable that is removably coupled to the main wiring board and the first wiring board,
wherein the main wiring board includes
a first output line;
a first input line;
a power supply circuit that outputs a first voltage to the first output line;
a plurality of terminals; and
a control circuit that is connected with the first input line, and
wherein the first cable includes
a first forward conductor that directly or indirectly connects the first output line and the first feedback line; and
a first return conductor that directly or indirectly connects the first input line and the first feedback line, and
wherein the plurality of terminals determines whether the first voltage output from the power supply circuit is input by the first input line to the control circuit by determining whether each section of a first circuit, which includes the power supply circuit, the first output line, and the first input line, is individually operating properly by receipt of an operational status signal from each section, and
(i) when the control circuit confirms that each section of the first circuit is individually operating properly, the control circuit starts a display on the display panel, and
(ii) when the control circuit confirms that each section of the first circuit is not individually operating properly, the control circuit outputs a signal indicating an anomaly of the first circuit has occurred and does not start the display on the display panel.

2. The display device according to claim 1, wherein the first forward conductor and the first return conductor are spaced apart from each other at an end portion of the first cable by at least half a width of the first cable at the end portion.

3. The display device according to claim 1, further comprising:
a second wiring board that includes a second feedback line; and
a second cable that is removably coupled to the main wiring board and the second wiring board,
wherein the main wiring board further includes a relay line, and
the first return conductor connects the relay line and the first feedback line, and
the second cable includes
a second forward conductor that directly or indirectly connects the relay line and the second feedback line; and
a second return conductor that directly or indirectly connects the first input line and the second feedback line.

4. The display device according to claim 3, wherein the main wiring board further includes a terminal that is connected with the relay line.

5. The display device according to claim 1, wherein the main wiring board further includes
a second output line;
a second input line; and
a second circuit that outputs a second voltage to the second output line,
wherein the control circuit is connected with the second input line,
wherein the display device further includes
a third wiring board that includes a third feedback line; and
a third cable that is removably coupled to the main wiring board and the third wiring board,
wherein the third cable includes
a third forward conductor that directly or indirectly connects the second output line and the third feedback line; and
a third return conductor that directly or indirectly connects the second input line and the third feedback line, and
wherein the control circuit determines whether the second voltage is input, and when an input of the second voltage is determined, starts a display on the display panel.

6. A method for checking a display device that includes
a display panel;
a main wiring board;
a first wiring board that includes a first feedback line; and
a first cable that removably connects the main wiring board and the first wiring board,
the main wiring board including
a first output line;
a first input line;
a power supply circuit that outputs a first voltage to the first output line;
a plurality of terminals; and
a control circuit that is connected with the first input line,
the first cable including
a first forward conductor that directly or indirectly connects the first output line and the first feedback line; and
a first return conductor that directly or indirectly connects the first input line and the first feedback line,
the method comprising:
outputting the first voltage by the power supply circuit;
determining, by the plurality of terminals, whether the first voltage output by the power supply circuit is input by the first input line to the control circuit by determining whether each section of a first circuit, which includes the power supply circuit, the first output line, and the first input line, is individually operating properly by receipt of an operational status signal from each section, and starting a display on the display panel when each section of the control circuit confirms that each section of the first circuit is individually operating properly, and outputting a signal indicating an anomaly of the first circuit has occurred and not starting the display on the display panel when each section of the control circuit confirms that the first circuit is not individually operating properly.

\* \* \* \* \*